United States Patent
Guthrie et al.

(10) Patent No.: US 6,323,598 B1
(45) Date of Patent: Nov. 27, 2001

(54) ENHANCED TRIM RESOLUTION VOLTAGE-CONTROLLED DIMMING LED DRIVER

(75) Inventors: Don W. Guthrie, North Richland Hills; Craig Jay Coley, Burleson, both of TX (US)

(73) Assignee: Aerospace Optics, Inc., Fort Worth, TX (US)

( * ) Notice: Subject to any disclaimer, the term of this patent is extended or adjusted under 35 U.S.C. 154(b) by 0 days.

(21) Appl. No.: 09/675,752

(22) Filed: Sep. 29, 2000

(51) Int. Cl.[7] .................................................. H05B 37/00
(52) U.S. Cl. .................. 315/200 A; 315/291; 315/169.3; 315/136; 362/227; 323/282
(58) Field of Search .............................. 315/169.1, 169.3, 315/164, 291, 200 A, 136, 185 R, 186; 362/800, 227; 323/267, 282; 250/552

(56) References Cited

U.S. PATENT DOCUMENTS

| | | | |
|---|---|---|---|
| 5,313,187 | * | 5/1994 | Choi et al. .................... 315/200 A X |
| 5,608,290 | * | 3/1997 | Hutchisson et al. ............. 315/200 A |
| 5,929,568 | * | 7/1999 | Eggers .................................... 315/56 |
| 5,959,413 | * | 9/1999 | Komarek et al. ..................... 315/306 |

* cited by examiner

Primary Examiner—Haissa Philogene (57) ABSTRACT

Illumination sources, each including at least one light emitting diode, are connected either in series or in parallel by a switching circuit, depending upon an applied input voltage. The switching circuit switches the illumination sources from series- to parallel-connection, or vice versa, when the applied input voltage crosses a threshold value in traversing the operating range of applied input voltages. Because the light emitting diodes within the illumination sources are switched from series to parallel connection at a defined kickover point, the voltage-luminance characteristic changes on opposite sides of the kickover point. The resulting overall voltage-luminance characteristic has greater variability in luminance across the entire operating range of applied input voltages, and luminance-variance is not limited to only a portion of the operating range. Greater trim resolution for voltage-controlled dimming of the light emitting diodes is therefore provided, with industry standard luminances being achieved at appropriate applied input voltages.

25 Claims, 4 Drawing Sheets

ENHANCED TRIM RESOLUTION VOLTAGE-CONTROLLED DIMMING LED DRIVER

BACKGROUND OF THE INVENTION

1. Field of the Invention

The present invention relates to driver circuits for light emitting diodes (LEDs) and in particular to driver circuits which provide voltage controlled dimming. Still more particularly, the present invention relates to a driver circuit providing enhanced trim resolution in voltage controlled dimming of light emitting diodes.

2. Description of the Prior Art

Like many other display systems, aircraft instrumentation displays frequently employ illuminated indicators. Originally incandescent bulbs were employed for this purpose. However, a variety of factors have motivated replacement of incandescent bulbs with light emitting diodes (LEDs) in such applications, including improvements in power consumption, heat generation, and operating lifetime.

Standards exist for the luminance, or brightness level, of illumination sources in aircraft instrumentation displays. Generally, for example, the luminance required for a sunlight-readable indicator must be in the range of at least 300–500 foot-lamberts. Similarly, the accepted indicator luminance for commercial night-flying is approximately 15–20 foot-lamberts; for military night-flying, approximately 1 foot-lambert; and for night vision imaging system (NVIS) compatible flying, approximately 0.1 foot-lambert. Additionally, for voltage-controlled dimming of illuminated indicators, the various voltage levels at which these luminance ranges are achieved (e.g., sunlight readable illumination at approximately 28 volts and commercial night flying illumination at approximately 14–15 volts) have also become effectively standardized by industry expectations, since aircraft instrumentation designers would prefer to utilize existing analog circuitry in implementing voltage-controlled dimming of illuminated indicators.

These luminance standards and corresponding voltage levels are based on incandescent bulbs as illumination sources within aircraft displays. However, LEDs have different luminance-power characteristics than incandescent bulbs. When replacing incandescent bulbs with LEDs in aircraft instrumentation, or when employing controls designed for incandescent bulbs with LEDs, alteration is required of the luminance-power characteristics of LEDs to satisfy the luminance standards and corresponding voltage level expectations.

One approach to satisfying the luminance standards and voltage level expectations when utilizing LEDs involves providing a mechanism for compensating for changing the portion of the applied input power which is actually transmitted to the LEDs. The portion of the applied input power which is transmitted to the LEDs changes across the operating range of input power to the LED illuminated indicator, matching the power transmitted to the LEDs to the power which is required by the LEDs to achieve approximately the same luminance as an incandescent bulb receiving the same input power. However, this approach negates at least some of the reduction in power consumption achieved by employing LEDs in lieu of incandescent bulbs.

Figure 6:
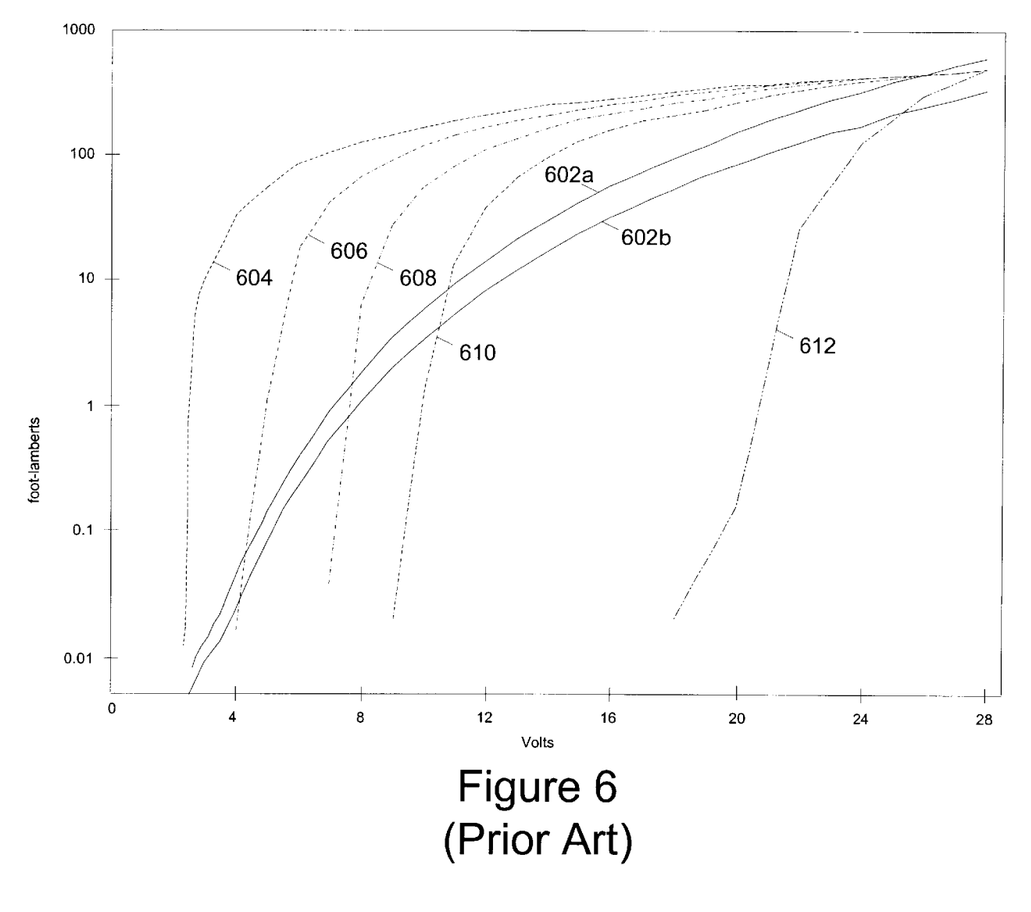
FIG. 6 is a comparative plot of voltage-luminance characteristics for common incandescent bulbs and for different numbers of series-connected LEDs.

An additional problem in satisfying the luminance standards and voltage level expectations with voltage controlled dimming of LEDs arises from the inherent luminance-power power characteristics of series-connected LEDs. Parallel-connected LEDs may be employed to increase luminance, but require proportionally more power than a single LED. Series-connected LEDs, although requiring less additional power over a single LED than is required by parallel-connected LEDs, have inherent voltage-luminance characteristics which are poorly suited to voltage-controlled dimming, as illustrated in FIG. 6. Curves 602a and 602b within FIG. 6 are voltage-luminance plots for two common types of incandescent bulbs. These curves provide significant changes in luminance across the operating range of input voltages as the applied input voltage is brought down from 28 volts to the minimum voltage required for illumination (about 2.5 volts).

Curves 604, 606, 608, 610 and 612 are voltage-luminance plots for, respectively, one LED, two series-connected LEDs, three series-connected LEDs, four series-connected LEDs, and eight series-connected LEDs, all with a series resistor to produce 300–500 foot lamberts at 28 volts. As can be seen from curve 604, for example, the luminance of a single LED falls off very gradually as the applied input voltage is brought down from 28 volts to about 6 volts, after which the luminance falls off rather sharply up to the turn-on voltage for the LED. This provides poor trim characteristics for voltage-controlled dimming of the LED, offering only a narrow range of applied input voltages within which significant changes in luminance are achieved. This limitation is exacerbated by the addition of more LEDs within a series-connection, which increases the turn-on voltage for the LEDs. As a result, curve 612, representing eight series-connected LEDs, provides extremely poor trim resolution for voltage-controlled dimming, and only within the upper half of a 28 volt operating range.

It would be desirable, therefore, to improve the trim characteristics of an LED illumination source to provide improved responsiveness of luminance to voltage changes across the entire operating range of applied input voltages. It would further be advantageous to employ series-connected LEDs for power savings and for improved trim characteristics.

SUMMARY OF THE INVENTION

Illumination sources, each including at least one light emitting diode, are connected either in series or in parallel by a switching circuit, depending upon an applied input voltage. The switching circuit switches the illumination sources from series- to parallel-connection, or vice versa, when the applied input voltage crosses a threshold value in traversing the operating range of applied input voltages. Because the light emitting diodes within the illumination sources are switched from series to parallel connection at a defined kickover point, the voltage-luminance characteristic changes on opposite sides of the kickover point. The resulting overall voltage-luminance characteristic has greater variability in luminance across the entire operating range of applied input voltages, and luminance-variance is not limited to only a portion of the operating range. Greater trim resolution for voltage-controlled dimming of the light emitting diodes is therefore provided, with industry standard luminances being achieved at appropriate applied input voltages.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION

The following description details the structure, application and features of the present invention, but it will be understood by those of skill in the art that the scope of the invention is defined only by the issued claims, and not by any description herein. The process steps and structures described below do not form a complete process for manufacturing illuminated instrumentation indicators. The present invention may be practiced in conjunction with common illuminated instrumentation indicator fabrication techniques, and only so much of the commonly practiced process steps are included as are necessary for an understanding of the present invention. The figures are not drawn to scale, but instead are drawn so as to illustrate the important features of the invention.

Figure 1:
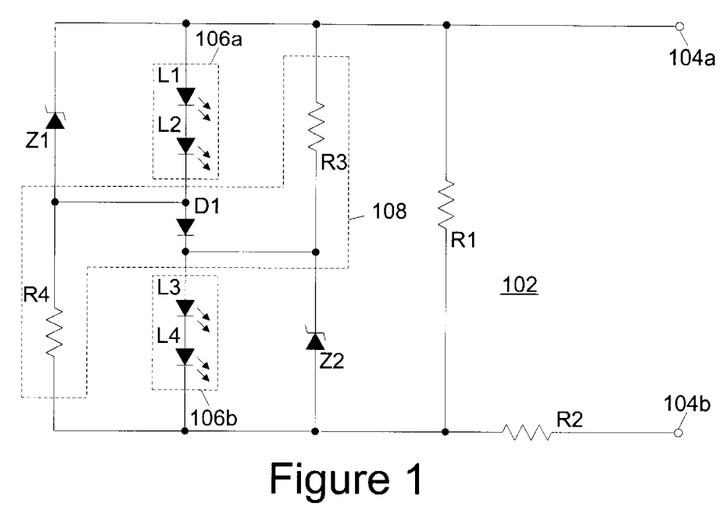
FIG. 1 depicts an enhanced trim resolution circuit for voltage-controlled dimming of light emitting diodes in accordance with a preferred embodiment of the present invention.

With reference now to the figures, and in particular with reference to FIG. 1, an enhanced trim resolution circuit for voltage-controlled dimming of light emitting diodes in accordance with a preferred embodiment of the present invention is depicted. Voltage-controlled dimming circuit 102 includes input and output ports 104a and 104b, across which the input voltage is applied. The input voltage applied across input and output ports 104a and 104b is variable and may be altered within a predefined operating range to change the luminance of light emitting diodes within circuit 102.

Circuit 102 also includes first and second groups 106a and 106b of series connected light emitting diodes (LEDs). In the exemplary embodiment, LED groups 106a and 106b each include two series-connected LEDs; however, the present invention may be suitably employed with any positive, nonzero, integer number of LEDs within each LED group 106a–106b, and the number of LEDs within one group 106a need not equal the number of LEDs within the other group 106b. In the exemplary embodiment of FIG. 1, LED group 106a includes LEDs L1 and L2 while LED group 106b includes LEDs L3 and L4.

Circuit 102 also includes a switching circuit 108 connected between and around LED groups 106a–106b. Switching circuit 108 switches LEDs groups 106a–106b from series-connection between input and output ports 104a–104b to parallel-connection between ports 104a–104b, or vice versa, as the applied input voltage across ports 104a–104b is varied across a threshold or "kickover" value. In the exemplary embodiment, switching circuit 108 includes a switching diode D1 connected in series between LED groups 106a and 106b, a first resistor R3 connected in parallel with both LED group 106a and switching diode D1, and a second resistor R4 connected in parallel with both LED group 106b and switching diode D1. The cathode of switching diode D1 is connected to the anode of the last LED L2 within LED group 106a and to one end of resistor R4; the anode of switching diode D1 is connected to the cathode of the first LED L3 within LED group 106b and to one end of resistor R3. An opposite end of resistor R3 is connected to the cathode of the first LED L1 within LED group 106a, and an opposite end of resistor R4 is connected to the anode of the last LED L4 within LED group 106b.

LED groups 106a and 106b (comprising series-connected LED pairs L1/L2 and L3/L4) are connected by switching circuit 108 either in series or in parallel between input and output ports 104a and 104b, depending on the voltage applied across the input and output ports 104a and 104b. Switching circuit 108 provides kickover from parallel-connection to series-connection, and vice versa, of the LED groups 106a and 106b. Switching diode D1, resistor R3 (connected in parallel with LED group 106a and switching diode D1), and resistor R4 (connected in parallel with LED group 106b and switching diode D1) enable the switching mechanism.

In operation, the circuit 102 operates in two modes: high luminance mode above the kickover point, where the applied input voltage across ports 104a and 104b is greater than the combined forward voltage drops (turn-on voltages) of LEDs L1–L4 and switching diode D1; and low luminance mode below the kickover point, where the applied input voltage across ports 104a and 104b is less than the combined forward voltage drops of LEDs L1–L4 and switching diode D1 (but greater than the combined forward voltage drops of either of LED pairs L1/L2 or L3/L4).

In high luminance mode, switching diode D1 conducts, and most of the current passes through the series-connected path of LED pair L1/L2, switching diode D1, and LED pair L3/L4. The primary current path for LED high luminance control is established by the high luminance resistor R2.

In low luminance mode, switching diode D1 stops conducting and the current passes through two parallel paths: LED pair L1/L2 and resistor R4, and resistor R3 and LED pair L3/L4. Low luminance mode is therefore invoked by applying an input voltage which is insufficient to allow forward current to flow through switching diode D1. The primary current path for LED low luminance control is established by the low luminance resistors R3–R4.

Resistor R1 provides a quiescent current path to prevent false or unintentional LED illumination at low current levels, and is located to allow the rise in current across the resistor with applied voltage to halt at the combined forward voltage drops of LEDs L1–L4 and switching diode D1, reducing unnecessary power loss at higher voltage inputs.

Zener diodes Z1 and Z2, in conjunction with high luminance resistor R2, provide circuit protection against transients, conducted electromagnetic susceptibility, or an electrostatic discharge event. Zener diodes Z1 and Z2 also prevent circuit failure should a single LED fail in an electrically open state, providing an alternate current path to maintain quadrant circuit integrity so that two LEDs will always remain illuminated under such a catastrophic failure condition.

Resistor R2 serves to limit the current of a transient or overvoltage event and also serves to limit the operating current to safe levels to prevent a potential catastrophic failure of the display circuitry.

Exemplary values for the components depicted in FIG. 1 are: resistor R1=4.32 kΩ; resistor R2=1.5 kΩ; resistors R3 and R4=20 kΩ; LEDs L1–L4 forward voltage drop=2.5–3.3 V; zener diodes Z1 and Z2 rated for about 6.6 V; and applied input voltage across ports 104a–104b anywhere in an operating range of 6–28 V. These component values provide a kickover point between high luminance mode and low luminance mode at about 16 V.

Circuit 102, which drives, dims, and protects the LEDs, is intended to improve low luminance level trimming resolution by configuring the circuit electrically in parallel, with two LEDs connected in series within each parallel circuit branch, for lower input voltages while allowing maximum power efficiency at high input voltages by electrically configuring the circuit so that all four LEDs are connected in series. The function of this dual mode, constant resistance LED driver circuit is to provide smooth, stable, voltage-controlled dimming from sunlight conditions to total darkness by taking advantage of the inherent voltage, current and luminance characteristics of the LEDs.

Figure 2:
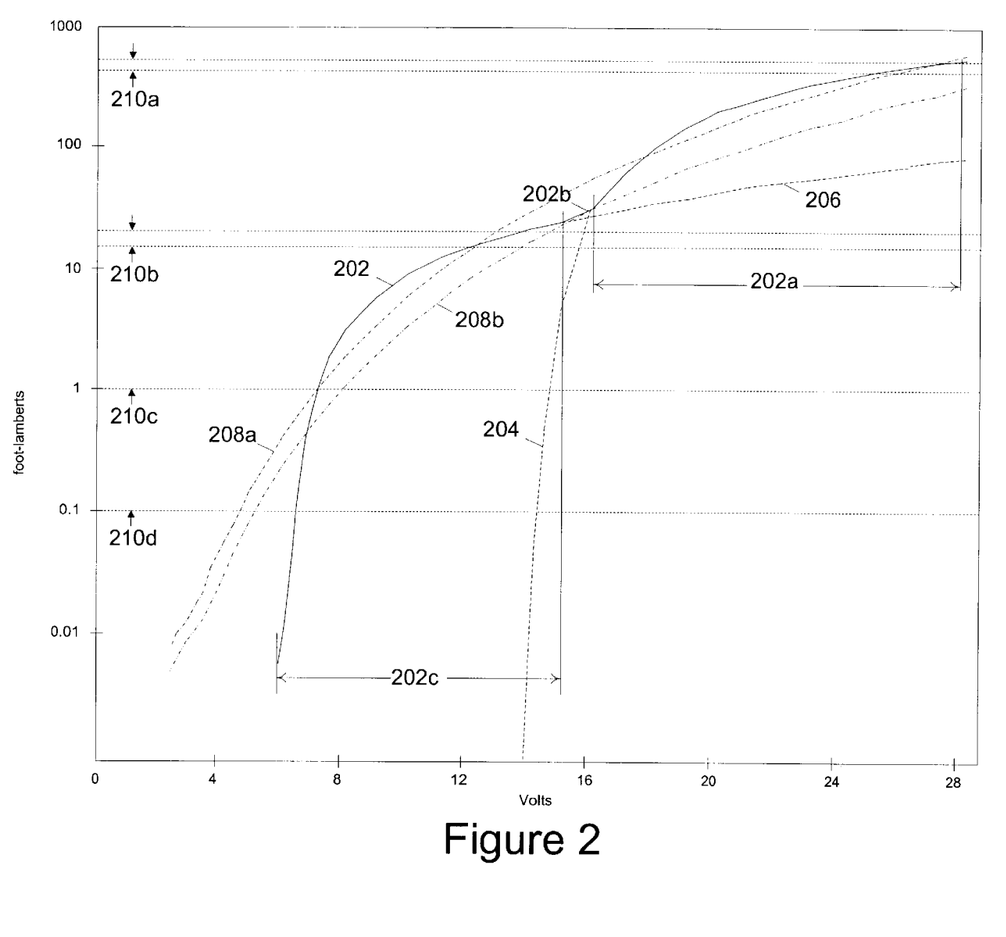
FIG. 2 is a plot of voltage-luminance characteristics of the enhanced trim resolution circuit for voltage-controlled dimming of light emitting diodes in accordance with a preferred embodiment of the present invention.

Referring to FIG. 2, a plot of voltage-luminance characteristics of the enhanced trim resolution circuit for voltage-controlled dimming of light emitting diodes in accordance with a preferred embodiment of the present invention is illustrated. The plot presented in FIG. 2 is the voltage-luminance characteristic of the circuit depicted in FIG. 1 with the exemplary component values listed above.

The voltage-luminance characteristic 202 for circuit 102 across the operating range of input voltages has two portions: a first portion 202a follows the voltage-luminance characteristic for four series-connected LEDs in an upper portion of the voltage-luminance curve 202, when circuit 102 is in high luminance mode above the kickover point 202b; a second portion 202c follows the voltage-luminance characteristic for two series-connected LEDs in a lower portion of the voltage-luminance curve 202, when circuit 102 is in low luminance mode below the kickover point 202b. The remaining portions 204 and 206 of the voltage-luminance characteristics for four series-connected LEDs and for two series-connected LEDs, respectively, are also shown in FIG. 2. It should be noted that the voltage-luminance curve 202 for circuit 102 does not precisely follow either the voltage-luminance characteristic for four series-connected LEDs or the voltage-luminance characteristic for two series-connected LEDs in a region proximate to the kickover point 202b because of the voltage divider effect formed by high luminance resistor R2 and quiescent current resistor R1.

Also illustrated in FIG. 2 for comparative reference are plots of the voltage-luminance characteristics 208a and 208b of two common incandescent bulbs, as well as reference lines for industry standard luminance ranges: the sunlight-readable range 210a (at least 300–500 foot-lamberts); the commercial night-flying range 210b (about 15–20 foot-lamberts); the military night-flying range 210c (approximately 1 foot lambert); and the NVIS compatible range 210d (approximately 0.1 foot lambert).

As illustrated in FIG. 2, circuit 102 provides enhanced trim resolution for voltage-controlled dimming of LED illumination sources, with greater variability in luminance as a function of applied input voltage across the operating range of applied input voltages and variability in luminance across the entire operating range of applied input voltages. Industry standard luminance ranges are achieved by circuit 102, and at corresponding voltage expectations, allowing circuit 102 to be employed with existing analog dimming controls.

Also illustrated in FIG. 2, circuit 102 does not attempt to match incandescent luminance for a particular applied input voltage or across the operating range of applied input voltages. Instead, circuit 102 follows classic LED voltage-luminance curves, switching from the voltage-luminance curve for four series-connected LEDs to the voltage-luminance curve for two series-connected LEDs at about the kickover point.

Within some tolerances, voltage-luminance characteristic 202 may be shaped by selection of appropriate resistance values for resistors R1 through R4 within circuit 102. Resistor R2 may be adjusted to control the highest luminance produced by circuit 102. Resistors R3 and R4 control the highest luminance which might be produced by the two parallel connected LED groups 306a and 306b, and therefore control the shape of the lower portion 202c of voltage-luminance characteristic 202. Shunt resistor R1 may be adjusted (relative to resistor R2) to control the location of kickover point 202b within the operating range of applied input voltages and the quiescent current at low voltage levels. In this manner, the shape of voltage-luminance characteristic 202 and the quiescent current may be adjusted to suit particular implementations for circuit 102.

Figure 3:
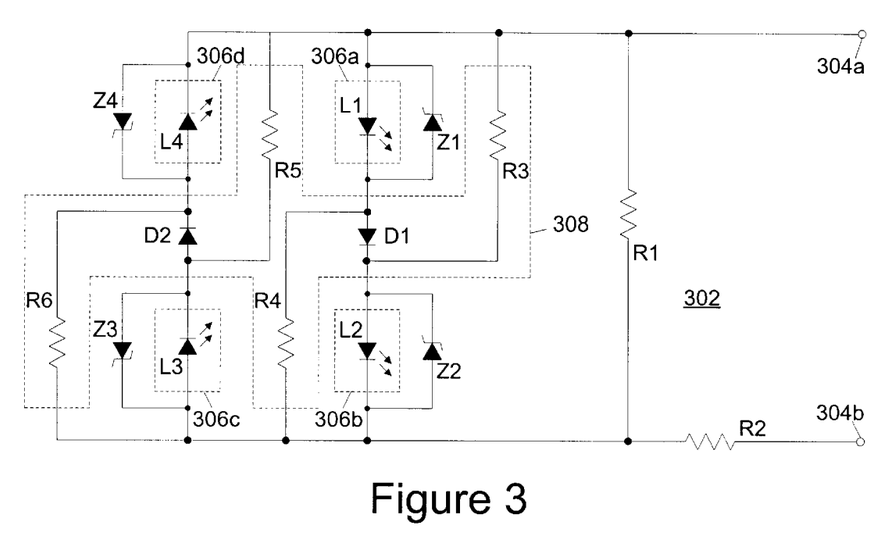
FIG. 3 depicts an alternating current embodiment of the enhanced trim resolution circuit for voltage-controlled dimming of light emitting diodes in accordance with a preferred embodiment of the present invention.

With reference now to FIG. 3, an alternating current embodiment of the enhanced trim resolution circuit for voltage-controlled dimming of light emitting diodes in accordance with a preferred embodiment of the present invention is depicted. The example depicted is intended for operation with alternating current of 5–7 volts, and would employ components having values differing from those described above in connection with FIG. 1.

Circuit 302 includes first and second LED groups 306a and 306b oriented in a one direction (with respect to anodes and cathodes of the LEDs) between input and output ports 304a and 304b, as well as third and fourth LED groups 306c and 306d oriented in an opposite direction from LED groups 306a and 306b between input and output ports 304a and 304b. Each LED group 306a–306d in this example includes only one LED.

Switching circuit 308 in circuit 302 includes two switching diodes D1 and D2 and resistors R3 through R6. Switching diode D1 is located between LED groups 306a and 306b, oriented in the same direction as the LEDs (L1 and L2, respectively) within those groups, while switching diode D2 is connected between LED groups 306c and 306d, oriented in the same direction as the LEDs (L3 and L4, respectively) within those groups. Resistor R3 is connected in parallel with LED group 306a and switching diode D1; resistor R4 is connected in parallel with LED group 306b and switching diode D1. Resistor R5 is connected in parallel with LED group 306d and switching diode D2; resistor R6 is connected in parallel with LED group 306c and switching diode D2.

For positive cycles of the applied input voltage (when the voltage at input port 304a is positive with respect to the voltage at input port 304b), current flows through LED groups 306a and 306b, switching diode D1 (if conducting), and resistors R3 and R4 (if switching diode D1 is not conducting). During negative cycles of the applied input voltage, current flows through LED groups 306c and 306d, switching diode D2 (if conducting), and resistors R5 and R6 (if switching diode D2 is not conducting). In this manner, illumination is achieved during both positive and negative cycles of the applied input power.

Figure 4:
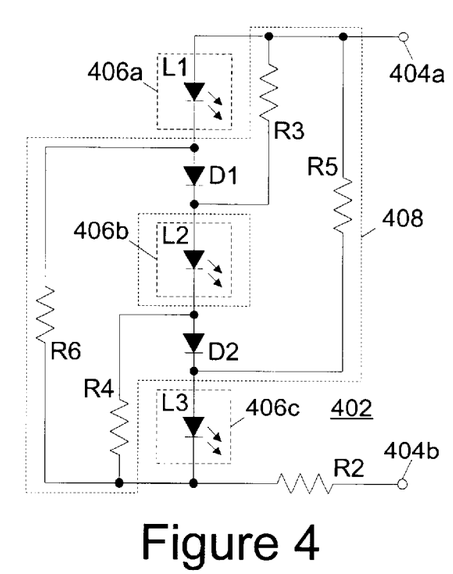
FIGS. 4 and 5 are alternative enhanced trim resolution circuits for voltage-controlled dimming of light emitting diodes in accordance with a preferred embodiment of the present invention.

Referring to FIG. 4, an alternative enhanced trim resolution circuit for voltage-controlled dimming of light emitting diodes in accordance with a preferred embodiment of the present invention is illustrated. Circuit 402 includes input and output ports 404a–404b, three light emitting diode groups 406a–406c, and a switching circuit 408. Each light emitting diode group 406a, 406b, and 406c contains only one LED L1, L2 and L2 in the example shown, although each group could contain more LEDs.

Switching circuit 408 includes: diode D1 connected in series between LED groups 406a and 406b; diode D2 connected in series between LED groups 406b and 406c; resistor R3 connected in parallel with LED group 406a and diode D1; resistor R4 connected in parallel with LED group 406c and diode D2; resistor R5 connected in parallel with LED group 406a, diode D1, LED group 406b, and diode D2; and resistor R6 connected in parallel with diode D1, LED group 406b, diode D2, and LED group 406c.

In operations, diodes D1 and D2 conduct when the voltage applied across input and output ports 404a–404b exceeds a threshold voltage, connecting LED groups 406a through 406c in series. Below the threshold voltage, diodes D1 and D2 stop conducting (preferably at the same time), leaving three parallel current paths between the input and output ports 404a–404b: LED group 406a and resistor R6; resistor R3, LED group 406b, and resistor R4; and resistor R5 and LED group 406c.

To achieve concurrent series- to parallel-connection switching, the resistances of resistors R5 and R6 should be the same, the resistances of resistors R3 and R4 should be the same, and the combined resistance of resistors R3 and R4 should equal the resistance of resistor R5 (or R6). Staggered series- to parallel-connection switching (e.g., LED group 406a switches from series-connection to parallel-connection with LED groups 406b and 406c at a first threshold, followed by LED group 406b switching from series-connection to parallel-connection with LED group 406c as a second threshold), although possible, will be accompanied by variance in LED luminance between different LED groups 406a–406c.

Figure 5:
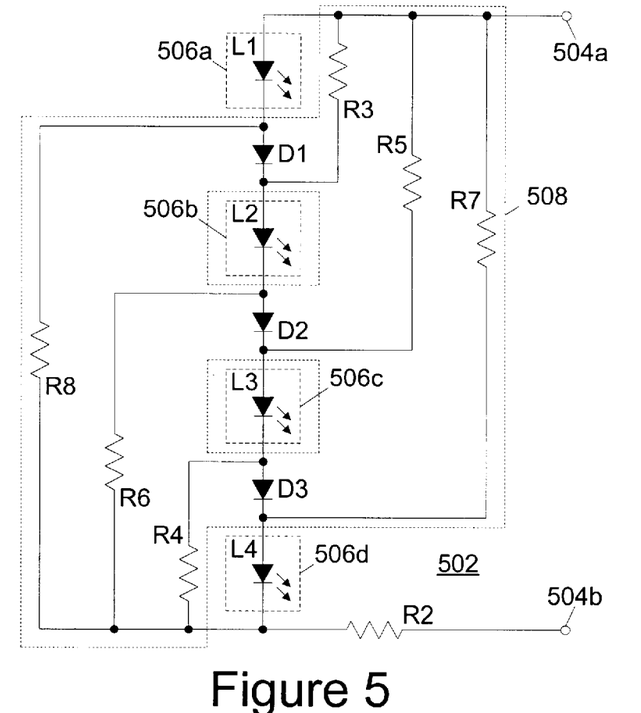

With reference now to FIG. 5, another alternative enhanced trim resolution circuit for voltage-controlled dimming of light emitting diodes in accordance with a preferred embodiment of the present invention is depicted. Circuit 502 switches four LED groups 506a–506d from series connection between input/output ports 504a–504b to parallel connection utilizing switching circuit 508. For concurrent parallel-to-series (or vice versa) connection switching, resistors R3 and R4 should have the same resistance, resistors R5 and R6 should have the same resistance, and resistors R7 and R8 should have the same resistance. Additionally, the combined resistance of resistors R3 and R6 (and therefore the combined resistance of resistors R5 and R4) should equal the resistance of resistor R7 (or R8).

Above the kickover point, diodes D1 through D3 within switching circuit 508 will all conduct, creating a series connection through LED groups 506a–506d. Below the kickover point, none of diodes D1 through D3 will conduct, leaving four parallel current paths each including one of LED groups 506a–506d together with one or more resistors.

Although not depicted in either FIG. 4 or FIG. 5, quiescent current (shunt) resistors and overvoltage protection (e.g., zener diodes in parallel with LED groups) may be optionally added to any implementation of the present invention.

While the invention has been particularly shown and described with reference to a preferred embodiment, it will be understood by those skilled in the art that various changes in form and detail may be made therein without departing from the spirit and scope of the invention.

What is claimed is:

1. A circuit for voltage-controlled dimming of light emitting diodes, comprising:

first and second light emitting diode groups connected between an input port and an output port; and a switching circuit coupled to the first and second light emitting diode groups, wherein the switching circuit switches the first and second light emitting diode groups between series-connection and parallel-connection.

2. The circuit of claim 1, wherein the switching circuit switches the first and second light emitting diode groups between series-connection and parallel-connection when a voltage applied across the input and output ports crosses a threshold value.

3. The circuit of claim 1, wherein the first and second light emitting diode groups each include two or more light emitting diodes.

4. The circuit of claim 1, wherein the first and second light emitting diode groups each include only one light emitting diode.

5. The circuit of claim 1, wherein the switching circuit further comprises:

a diode connected in series between the first and second light emitting diode groups;

a first resistor connected in parallel with the diode and the first light emitting diode group; and a second resistor connected in parallel with the diode and the second light emitting diode group.

6. The circuit of claim 1, further comprising:

a quiescent current resistor connected between the input and output ports in parallel with the first and second light emitting diode groups and the switching circuit.

7. The circuit of claim 1, further comprising:

a current limiting resistor connected to either the input port or the output port in series with the first and second light emitting diode groups and the switching circuit.

8. The circuit of claim 1, further comprising:

overvoltage protection connected in parallel with each of the first and second light emitting diode groups.

9. The circuit of claim 1, further comprising:

third and fourth light emitting diode groups connected between the input and output ports with a forward bias orientation, with respect to the input and output ports, which is opposite a forward bias orientation of the first and second light emitting diode groups, wherein the switching device switches the third and fourth light emitting diode groups between series-connection and parallel-connection.

10. The circuit of claim 9, wherein the switching device further comprises:

a first diode connected in series between the first and second light emitting diode groups, wherein the first diode and all light emitting diodes within the first and second light emitting diode groups have a first forward bias orientation with respect to the input and output ports;

a second diode connected in series between the third and fourth light emitting diode groups, wherein the second diode and all light emitting diodes within the third and fourth light emitting diode groups have a second forward bias orientation with respect to the input and output ports;

a first resistor connected in parallel with the first light emitting diode group and the first diode;

a second resistor connected in parallel with the second light emitting diode group and the first diode;

a third resistor connected in parallel with the third light emitting diode group and the second diode; and a fourth resistor connected in parallel with the fourth light emitting diode group and the second diode.

11. The circuit of claim 1, further comprising:

a third light emitting diode group connected between the input and output ports, wherein the switching circuit is coupled to the second and third light emitting diode groups and switches the second and third light emitting diode groups between series-connection and parallel-connection.

12. The circuit of claim 11, wherein the switching circuit further comprises:

a first diode connected in series between the first and second light emitting diode groups;

a second diode connected in series between the second and third light emitting diode groups;

a first resistor connected in parallel with the first diode and the first light emitting diode group;

a second resistor connected in parallel with the first and second diodes and the first and second light emitting diode groups;

a third resistor connected in parallel with the first and second diodes and the second and third light emitting diode groups; and a fourth resistor connected in parallel with the second diode and the third light emitting diode group.

13. The circuit of claim 11, further comprising:

a fourth light emitting diode group connected between the input and output ports, wherein the switching circuit is coupled to the third and fourth light emitting diode groups and switches the third and fourth light emitting diode groups between series-connection and parallel-connection.

14. The circuit of claim 13, wherein the switching circuit further comprises:

a first diode connected in series between the first and second light emitting diode groups;

a second diode connected in series between the second and third light emitting diode groups;

a third diode connected in series between the third and fourth light emitting diode groups;

a first resistor connected in parallel with the first diode and the first light emitting diode group;

a second resistor connected in parallel with the first and second diodes and the first and second light emitting diode groups;

a third resistor connected in parallel with the first, second and third diodes and the first, second and third light emitting diode groups;

a fourth resistor connected in parallel with the first, second and third diodes and the second, third and fourth light emitting diode groups;

a fifth resistor connected in parallel with the second and third diodes and the third and fourth light emitting diode groups; and a sixth resistor connected in parallel with the third diode and the fourth light emitting diode group.

15. The circuit of claim 13, further comprising:

a current limiting resistor connected between the input an output ports in series with the first, second, third and fourth light emitting diode groups and the switching circuit.

16. A circuit for voltage-controlled dimming of light emitting diodes, comprising:

a first LED illumination source coupled to a first port and including at least one light emitting diode;

a second LED illumination source coupled to a second port and including at least one light emitting diode;

a switching circuit connected between and around the first and second LED illumination sources, the switching circuit connecting the first and second LED illumination sources in series or in parallel based upon a voltage applied across the first and second ports.

17. The circuit of claim 16, wherein the switching circuit connects the first and second LED illumination sources in parallel when the voltage applied across the first and second ports is less than a threshold voltage and connects the first and second LED illumination sources in series when the voltage applied across the first and second ports is at least the threshold voltage.

18. The circuit of claim 17, wherein the switching circuit switches the first and second LED illumination sources between series connection and parallel connection when the voltage applied across the first and second ports crosses the threshold voltage.

19. The circuit of claim 18, wherein the switching circuit switches the first and second LED illumination sources from series connection to parallel connection when the voltage applied across the first and second ports changes from a voltage greater than the threshold voltage to a voltage less than the threshold voltage and switches the first and second LED illumination sources from parallel connection to series connection when the voltage applied across the first and second ports changes from a voltage less than the threshold voltage to a voltage greater than the threshold voltage.

20. A voltage-controlled LED dimming circuit, comprising:

a first light emitting diode, a diode, and a second light emitting diode connected with a common forward bias orientation in series between input and output ports;

a first resistor connected in parallel with the first light emitting diode and the diode; and a second resistor connected in parallel with the second light emitting diode and the diode.

21. The voltage-controlled LED dimming circuit of claim 20, wherein:

when a voltage applied across the input and output ports equals or exceeds a combined voltage drop for the diode and the first and second light emitting diodes, the diode conducts and provides a series connection between the first and second light emitting diodes, and when the voltage applied across the input and output ports does not equal or exceed the combined voltage drop for the diode and the first and second light emitting diodes, the diode does not conduct, leaving the first light emitting diode and the second resistor connected in parallel with the second light emitting diode and the first resistor between the input and output ports.

22. The voltage-controlled LED dimming circuit of claim 20, further comprising:

a third light emitting diode connected in series between the first light emitting diode and the diode and in parallel with the first resistor;

a fourth light emitting diode connected in series between the diode and the second light emitting diode and in parallel with the second resistor;

a quiescent current resistor connected between the input and output ports in parallel with the first, second, third and fourth light emitting diodes, the diode, and the first and second resistors;

a current limiting resistor connected between the input and output ports in series with the first, second, third and fourth light emitting diodes, the diode, and the first and second resistors;

a first zener diode connected in parallel with the first and third light emitting diodes; and a second zener diode connected in parallel with the second and fourth light emitting diodes.

23. The voltage-controlled LED dimming circuit of claim 22, wherein:

when a voltage applied across the input and output ports equals approximately 28 volts, a luminance of the first, second, third and fourth light emitting diodes equals approximately 300–500 foot lamberts;

when the voltage applied across the input and output ports equals approximately 14–15 volts, a luminance of the first, second, third and fourth light emitting diodes equals approximately 15–20 foot lamberts;

when the voltage applied across the input and output ports equals approximately 7–9 volts, a luminance of the first, second, third and fourth light emitting diodes equals approximately 1 foot lambert; and when the voltage applied across the input and output ports equals approximately 6.4 volts, a luminance of the first, second, third and fourth light emitting diodes equals approximately 0.1 foot lamberts.

24. The voltage-controlled LED dimming circuit of claim 22, wherein the first, second, third and fourth light emitting diodes each have a forward voltage drop of approximately 2.5–3.3 V, the first and second resistors each have a resistance of approximately 20 kΩ, the quiescent current resistor has a resistance of approximately 4.32 kΩ, the current-limiting resistor has a resistance of approximately 1.5 kΩ, and the zener diodes are rated for about 6.6 V.

25. The voltage-controlled LED dimming circuit of claim 20, wherein:

when a voltage applied across the input and output ports equals or exceeds a threshold voltage, the circuit operates in a high luminance mode with the first and second light emitting diodes connected in series, and when the voltage applied across the input and output ports does not equal or exceed the threshold voltage, the circuit operates in a low luminance mode with the first and second light emitting diodes connected in parallel.

* * * * *